(12) United States Patent
Scott et al.

(10) Patent No.: US 10,929,286 B2
(45) Date of Patent: Feb. 23, 2021

(54) ARBITRATED MANAGEMENT OF A SHARED NON-VOLATILE MEMORY RESOURCE

(71) Applicant: Seagate Technology LLC, Cupertino, CA (US)

(72) Inventors: Benjamin J. Scott, Longmont, CO (US); Steven S. Williams, Longmont, CO (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 19 days.

(21) Appl. No.: 16/023,071

(22) Filed: Jun. 29, 2018

(65) Prior Publication Data

US 2020/0004672 A1    Jan. 2, 2020

(51) Int. Cl.
| | |
|---|---|
| G06F 12/02 | (2006.01) |
| G06F 9/48 | (2006.01) |
| G06F 13/16 | (2006.01) |
| G06F 11/10 | (2006.01) |
| G11C 16/10 | (2006.01) |
| G11C 16/04 | (2006.01) |

(52) U.S. Cl.
CPC ........ *G06F 12/0246* (2013.01); *G06F 9/4881* (2013.01); *G06F 11/1076* (2013.01); *G06F 12/0253* (2013.01); *G06F 13/1663* (2013.01); *G06F 13/1673* (2013.01); *G11C 16/0483* (2013.01); *G11C 16/10* (2013.01); *G06F 2212/7201* (2013.01); *G06F 2212/7205* (2013.01)

(58) Field of Classification Search
CPC ............ G06F 12/0246; G06F 12/0253; G06F 9/4881; G06F 11/1076; G06F 13/1663; G06F 13/1673; G06F 2212/7201; G06F 2212/7205; G11C 16/0483; G11C 16/10
See application file for complete search history.

(56) References Cited

U.S. PATENT DOCUMENTS

| | | | |
|---|---|---|---|
| 6,067,608 A | 5/2000 | Perry | |
| 6,178,486 B1 | 1/2001 | Gill et al. | |
| 8,732,424 B2 | 5/2014 | Lee et al. | |
| 8,776,049 B2 | 7/2014 | Walker | |
| 9,183,087 B2 | 11/2015 | DeCenzo | |

(Continued)

*Primary Examiner* — Nanci N Wong
(74) *Attorney, Agent, or Firm* — Hall Estill Attorneys at Law

(57) ABSTRACT

Apparatus and method for managing shared resources in a data storage device such as a solid-state drive (SSD). In some embodiments, a non-volatile memory (NVM) has a population of semiconductor memory dies to which are connected a number of parallel channel. A controller circuit apportions the semiconductor memory dies into a plurality of die sets each configured to store user data blocks associated with a different user during hot data transfers responsive to a sequence of host access commands. A shared resource is available for use by each of the die sets to support background data transfers not associated with the host access commands, such as a RAID buffer. The controller circuit arbitrates the use of the shared resource by each of the die sets in turn to sequentially perform the background data transfers to maintain a selected level of deterministic performance of the hot data transfers.

21 Claims, 7 Drawing Sheets

(56) References Cited

U.S. PATENT DOCUMENTS

| | | | |
|---|---|---|---|
| 2009/0259800 A1* | 10/2009 | Kilzer | G06F 12/0246 |
| | | | 711/103 |
| 2015/0082319 A1* | 3/2015 | Liu | G06F 9/3851 |
| | | | 718/107 |
| 2015/0154108 A1* | 6/2015 | Gorobets | G06F 12/0246 |
| | | | 711/103 |
| 2016/0179386 A1* | 6/2016 | Zhang | G06F 3/0679 |
| | | | 711/103 |
| 2017/0185537 A1* | 6/2017 | Liao | G06F 3/0622 |
| 2018/0307503 A1* | 10/2018 | Peltz | G06F 9/4418 |
| 2018/0373438 A1* | 12/2018 | Bennett | G06F 3/0608 |
| 2018/0373450 A1* | 12/2018 | Ji | G06F 3/0623 |
| 2019/0050161 A1* | 2/2019 | Wysocki | G06F 3/061 |

\* cited by examiner

TIME-SLICE BUFFER MANAGEMENT

ROUND-ROBIN BUFFER MANAGEMENT

PRIORITY-BASED BUFFER MANAGEMENT

SERVICING HOST TRANSFERS

SERVICING BACKGROUND TRANSFERS

ARBITRATED MANAGEMENT OF A SHARED NON-VOLATILE MEMORY RESOURCE

SUMMARY

Various embodiments of the present disclosure are generally directed to the management of shared resources in a multi-user storage environment, such as but not limited to RAID buffers used to generate parity values for data sets written to a flash memory in a solid state drive (SSD).

In accordance with some embodiments, a non-volatile memory (NVM) has a population of semiconductor memory dies to which are connected a number of parallel channels. A controller circuit apportions the semiconductor memory dies into a plurality of die sets each configured to store user data blocks associated with a different user during hot data transfers responsive to a sequence of host access commands. A shared resource is available for use by each of the die sets to support background data transfers not associated with the host access commands, such as a RAID buffer. The controller circuit arbitrates the use of the shared resource by each of the die sets in turn to sequentially perform the background data transfers to maintain a selected level of deterministic performance of the hot data transfers.

These and other features which may characterize various embodiments can be understood in view of the following detailed discussion and the accompanying drawings.

DETAILED DESCRIPTION

Figure 1:
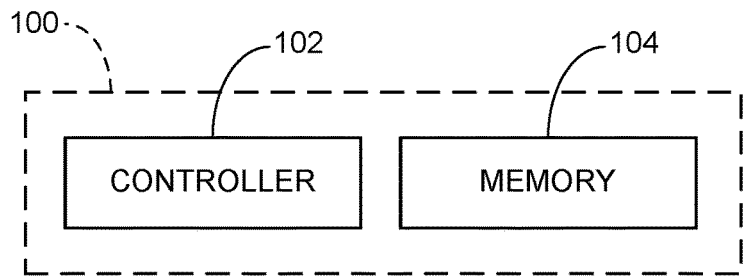
FIG. 1 provides a functional block representation of a data storage device in accordance with various embodiments.

Solid state drives (SSDs) are data storage devices that store user data in non-volatile memory (NVM) made up of an array of solid-state semiconductor memory cells. SSDs usually have an NVM module and a controller. The controller directs the transfer of user data between the NVM and a host device. The NVM will usually be NAND flash memory, but other forms of solid-state memory can be used.

The NVMe specification is an industry adopted standard that describes various interface and operational characteristics of SSDs and other NVM storage devices. The NVMe specification allows different portions of an SSD storage capacity to be assigned to different users for concurrent access and use via one or more PCIe (Peripheral Component Interface Express) interfaces. The portion of the capacity assigned to each NVMe user is referred to as an "NVM set" or "namespace." The specification provides that NVM sets are logically separate and may be physically separate as well, although at present the specification does not go into detail on how an NVM set may be physically separated from the rest of the SSD memory.

Metadata is often generated and used to describe and control the data stored to the NVM of an SSD. The metadata often takes the form of a map structure that tracks the locations of data blocks written to various locations within the flash memory. Because the map structures enable the system to locate, update and retrieve user data blocks, significant system resources are often required to maintain the integrity of the map including the periodic writing of snapshots (segments) and intervening journal updates to the NVM for backup retention purposes.

Flash memory is characterized as erasable memory since once a set of data has been written to a group of flash memory cells, the memory cells generally require the application of an erasure operation before new data can be written to the cells. This is in contrast to rewritable memory which generally allows new data to be overwritten in place without the need for an intervening erasure operation.

Each time a new version of a given user data block is written to a flash memory (or other erasable memory), the new version of the data block will be written to a different location, and the older version(s) of the data block will be marked as stale (invalid). Forward pointers and other mechanisms can be incorporated into the map data to enable the system to perform a forward search to locate the most current version of a particular data block.

NAND flash memory cells are arranged into erasure blocks, which represent the smallest grouping of memory cells that can be erased at a time. Garbage collection operations are carried out as background routines to periodically recycle the erasure blocks for reuse. A garbage collection operation generally includes searching the erasure block(s) for current version data, rewriting the current version data to a new location, and then applying an erasure operation to reset the memory cells. Erasure blocks are usually grouped into larger garbage collection units (GCUs)

that incorporate erasure blocks from different dies and which can be erased and allocated as a unit.

It follows that SSDs and other data storage devices with erasable memory are often configured to carry out three (3) main operations: (1) hot data transfers, which involve servicing host commands to transfer user data to and from the NVM; (2) cold data transfers, which are non-host based (e.g., background) transfers of current version data to a new location within the NVM for various reasons such as during garbage collection operations, and (3) map data updates, which are another form of non-host based (background) transfers in which map data snapshots and/or journal updates are written to the NVM. Each of these types of data (hot, cold, map) are managing using a "thread," which can be thought of as a package of processes and resources that need to be sequentially used to complete the data transfer.

Servicing the hot data transfers should usually be given relatively higher priority, since these are commands that are directly associated with the associated user. Deterministic processing modes require the SSD or other storage device to provide host performance at some specified I/O transfer rate level or other metric. The background transfers should be carried out at a sufficient rate to ensure adequate storage space is available and map integrity is maintained to support the hot data transfers. A complicating factor associated with the execution of the background transfers is the need to allocate shared resources, such as buffers, to complete various operations among a number of competing threads.

Various embodiments of the present disclosure are directed to an apparatus and method for allocating shared resources among different concurrent users of a data storage device. As explained below, some embodiments divide a population of semiconductor memory dies into a plurality of die sets, each die set assigned to a different user for the storage of user data blocks. A shared resource is provided to support background write operations to the various die sets. A manager circuit arbitrates the use of the shared resource among the various users.

While not necessarily limiting, in at least some embodiments the shared resource is a buffer used to accumulate parity data for the writing of map data and relocated user data. The term "buffer" is used herein broadly to describe an available memory location used for a specific purpose to temporarily store user or control data, and may be a separate integrated circuit device, a portion of embedded memory (e.g., SRAM), etc. The manager circuit arbitrates the use of the buffer in a number ways, including using a time-slice approach, a round-robin approach or a priority-based approach.

The time-slice approach generally uses a timer to denote time windows of sufficient duration to complete all actions necessary to use and free the buffer. The time windows are assigned to each die set in turn in a sequential, rotating fashion. The controller associated with each die set is offered the use of the buffer at the beginning of its associated window. Generally, the set can only use the buffer if the set is ready to write data to the buffer at the beginning of the window or if the set determines that the use of the buffer can be completed prior to the end of the window. If a set does not use the buffer during a particular window, the buffer may remain unused until the next window commences. This approach maximizes predictability and enables the various controllers to plan the execution of processes among multiple threads with the known future availability of the buffer.

The round-robin approach is similar to the time slice-approach, in that each of the controllers for the associated die sets are repetitively offered the use of the buffer in a repeating sequence. If a particular set does not need the buffer at a particular point in time, the manager circuit offers the buffer to the next set in the sequence. While this approach reduces predictability, it does tend to enhance usage efficiency since the buffer will not sit idle while a thread associated with a different die set could use the buffer to advance the workload The priority-based approach takes into account different levels of priority that may be temporarily assigned to the various sets in turn. For example, the NVMe specification allows an SSD to enter into a period of deterministic operation (a so-called deterministic window, or DW) for a given die set in which a guaranteed level of I/O performance is assured. In such cases, priority is given to any die set that has entered a DW or other relatively higher priority level of operation.

These and other features and advantages of various embodiments can be understood beginning with a review of FIG. 1 which shows a functional block diagram of a data storage device 100. The device 100 has a controller 102 and a memory module 104.

The controller block 102 represents a hardware based and/or programmable processor based circuit configured to provide top level communication and control functions. The memory module 104 includes solid state non-volatile memory (NVM) for the storage of user data from a host device.

Figure 2:
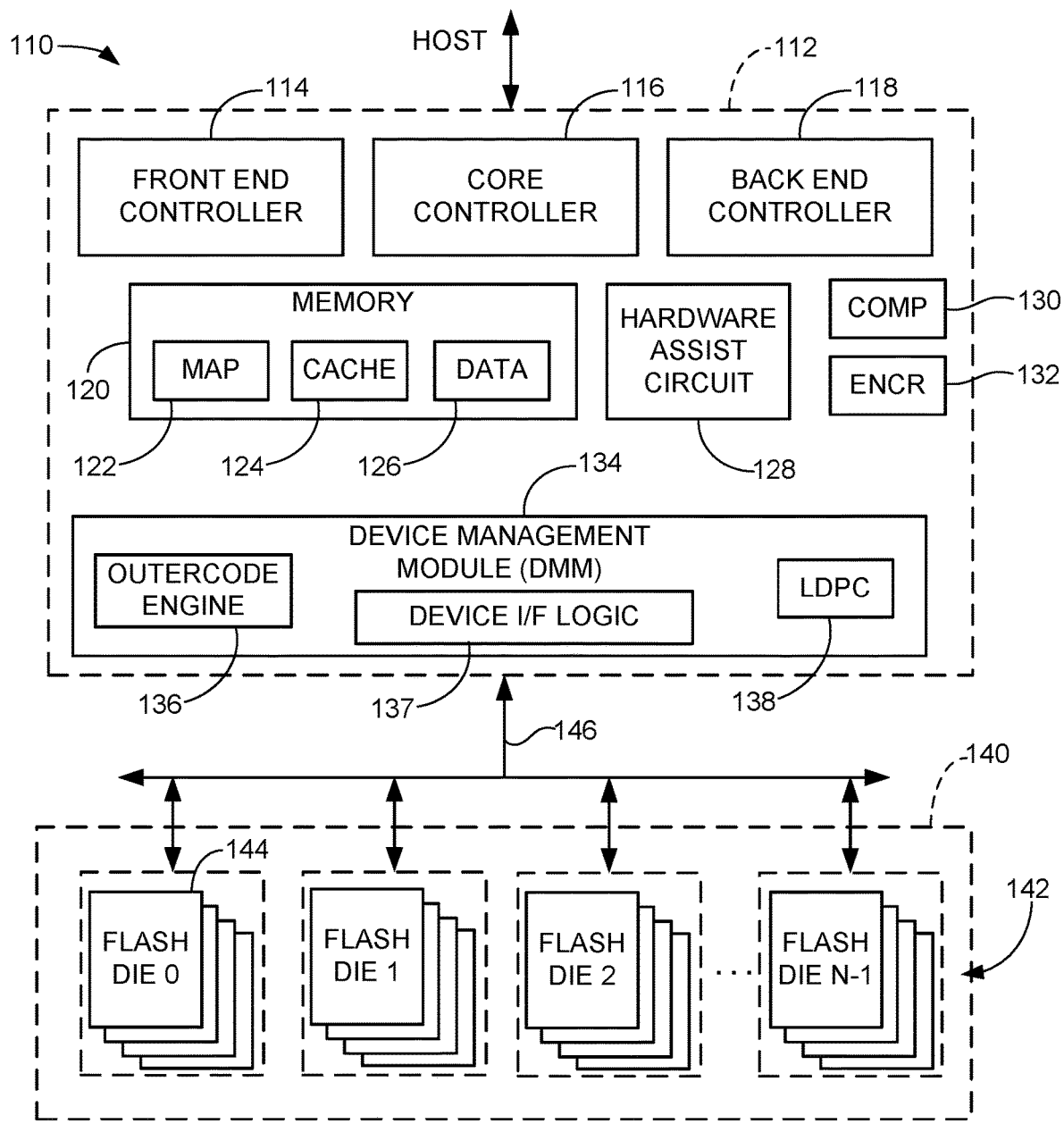
FIG. 2 shows aspects of the device of FIG. 1 characterized as a solid state drive (SSD) in accordance with some embodiments.

FIG. 2 shows a data storage device 110 as a particular embodiment of the device 100 in FIG. 1. The device 110 is configured as a solid state drive (SSD) that communicates with one or more host devices via one or more Peripheral Component Interface Express (PCIe) ports. The NVM is contemplated as comprising NAND flash memory, although other forms of solid state non-volatile memory can be used.

In at least some embodiments, the SSD operates in accordance with the NVMe (Non-Volatile Memory Express) Standard, which enables different users to allocate NVM sets (die sets) for use in the storage of data. Each NVM set may form a portion of an NVMe namespace that may span multiple SSDs or be contained within a single SSD.

The SSD 110 includes a controller circuit 112 with a front end controller 114, a core controller 116 and a back end controller 118. The front end controller 114 performs host I/F functions, the back end controller 118 directs data transfers with the memory module 140 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can alternatively be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 112, such as a data compression block 130 and an encryption block 132. The data compression block 130 applies lossless data compression to input data sets during write operations, and subsequently provides data de-compression during read operations. The encryption block 132 provides any number of cryptographic functions to input data including encryption, hashes, decompression, etc.

A device management module (DMM) 134 supports back end processing operations and may include an outer code engine circuit 136 to generate outer code, a device I/F logic circuit 137 and a low density parity check (LDPC) circuit 138 configured to generate LDPC codes as part of the error detection and correction strategy used to protect the data stored by the SSD 110.

A memory module 140 corresponds to the memory 104 in FIG. 1 and includes a non-volatile memory (NVM) in the form of a flash memory 142 distributed across a plural number N of flash memory dies 144. Rudimentary flash memory control electronics (not separately shown in FIG. 2) may be provisioned on each die 144 to facilitate parallel data transfer operations via a number of channels (lanes) 146.

Figure 3:
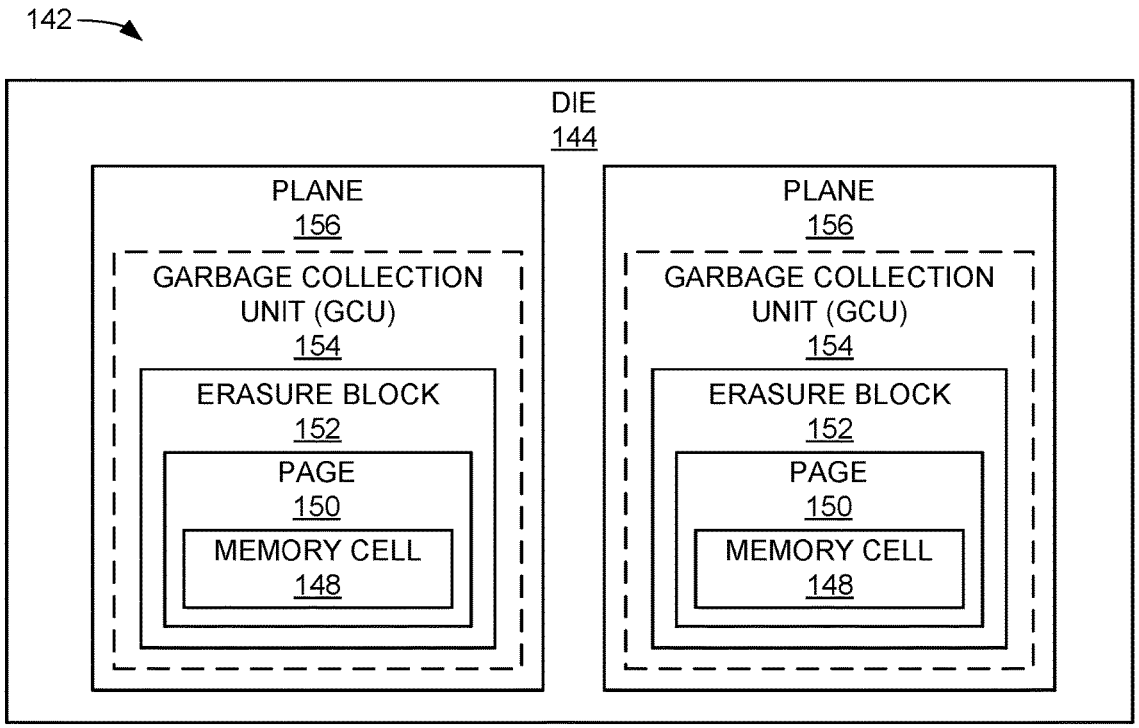
FIG. 3 shows an arrangement of the flash memory of FIG. 2 in some embodiments.

FIG. 3 shows an arrangement of the various flash memory dies 144 in the flash memory 142 of FIG. 2 in some embodiments. Each die 144 incorporates a large number of flash memory cells 148. The cells may be arrayed in a two-dimensional (2D) or three-dimensional (3D stacked) arrangement with various control lines (e.g., source, bit, word lines) to access the cells.

Groups of cells 148 are interconnected to a common word line to accommodate pages 150, which represent the smallest unit of data that can be accessed at a time. Depending on the storage scheme, multiple pages of data may be written to the same physical row of cells, such as in the case of MLCs (multi-level cells), TLCs (three-level cells), XLCs (four-level cells), and so on. Generally, n bits of data can be stored to a particular memory cell 148 using 2n different charge states (e.g., TLCs use eight distinct charge levels to represent three bits of data, etc.). The storage size of a page can vary; current generation flash memory pages can store, in some cases, 16 KB (16,384 bytes) of user data.

The memory cells 148 associated with a number of pages are integrated into an erasure block 152, which represents the smallest grouping of memory cells that can be concurrently erased in a NAND flash memory. A number of erasure blocks 152 are in turn incorporated into a garbage collection unit (GCU) 154, which utilizes erasure blocks across different dies as explained below. GCUs are allocated and erased as a unit.

During operation, a selected GCU is allocated for the storage of user data, and this continues until the GCU is filled. Once a sufficient amount of the stored data is determined to be stale (e.g., no longer the most current version), a garbage collection operation can be carried out to recycle the GCU. This includes identifying and relocating the current version data to a new location, followed by an erasure operation to reset the memory cells to an erased (unprogrammed) state. The recycled GCU is returned to an allocation pool for subsequent allocation to begin storing new user data. In one embodiment, each GCU 154 nominally uses a single erasure block 152 from each of a plurality of dies 144, such as 32 dies.

Each die 144 may further include a plurality of planes 156. Examples include two planes per die as shown in FIG. 3, although other numbers of planes per die, such as four planes per die, etc. can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
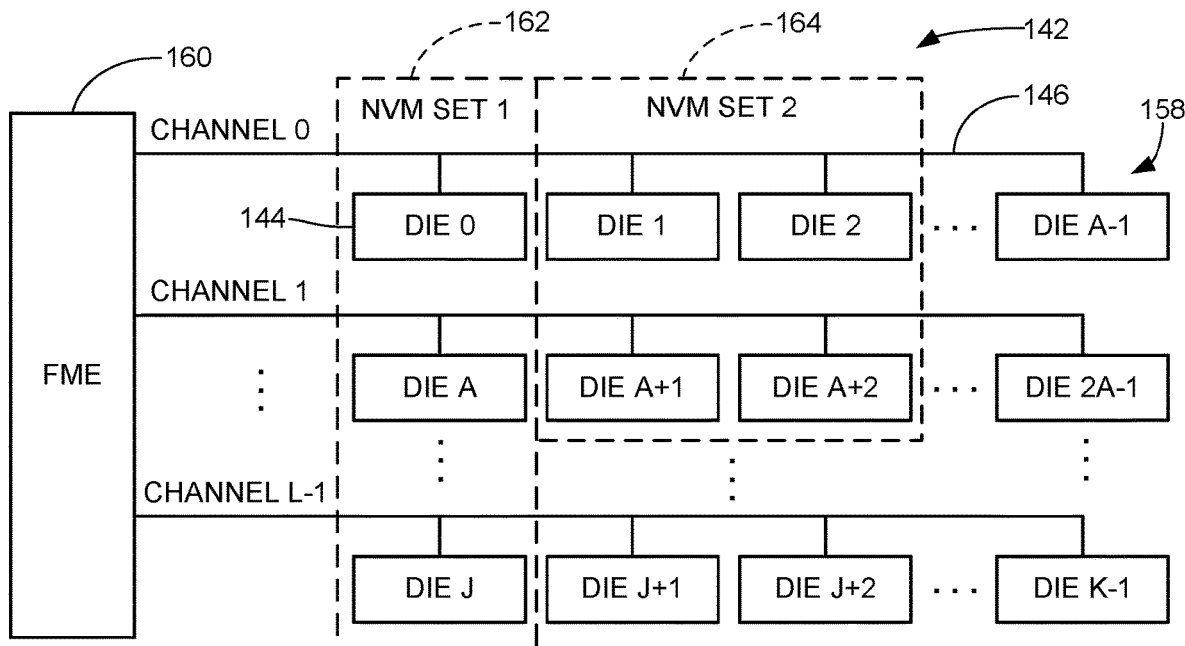
FIG. 4 illustrates the use of channels to access the dies in FIG. 3 in some embodiments.

FIG. 4 shows further aspects of the flash memory 142 in some embodiments. A total number K dies 144 are provided and arranged into physical die groups 158. Each die group 158 is connected to a separate channel 146 using a total number of L channels. A flash memory electronics (FME) circuit 160 of the flash memory module 142 controls each of the channels 146 to transfer data to and from the respective die groups 158. In one example, K is set to 128 dies, L is set to 8 channels, and each physical die group has 16 dies. In this way, any of the 16 dies connected to a given channel 146 can be accessed at a given time using the associated channel.

In some embodiments, the various dies are arranged into one or more NVM sets. An NVM set, also referred to a die set, represents a portion of the storage capacity of the SSD that is allocated for use by a particular host (user/owner). NVM sets are established with a granularity at the die level, so that each NVM set will encompass a selected number of the available dies 144.

A first example NVM set is denoted at 162 in FIG. 4. This first set 162 uses a single die 144 from each of the different channels 146. This arrangement provides fast performance during the servicing of data transfer commands for the set since all eight channels 146 are used to transfer the associated data to service a host access command. A limitation with this approach is that if the set 162 is being serviced, no other NVM sets can be serviced during that time interval. While the set 162 only uses a single die from each channel, the set could also be configured to use multiple dies from each channel, such as four (4) dies per channel for a total of 32 dies.

A second example NVM set is denoted at 164 in FIG. 4. This set uses dies 144 from less than all of the available channels 146. This arrangement provides relatively slower overall performance during data transfers as compared to the set 162, since for a given size of data transfer, the data will be transferred using fewer channels. However, this arrangement advantageously allows the SSD to service multiple NVM sets at the same time, provided the sets do not share the same (e.g., an overlapping) channel 146.

Figure 5:
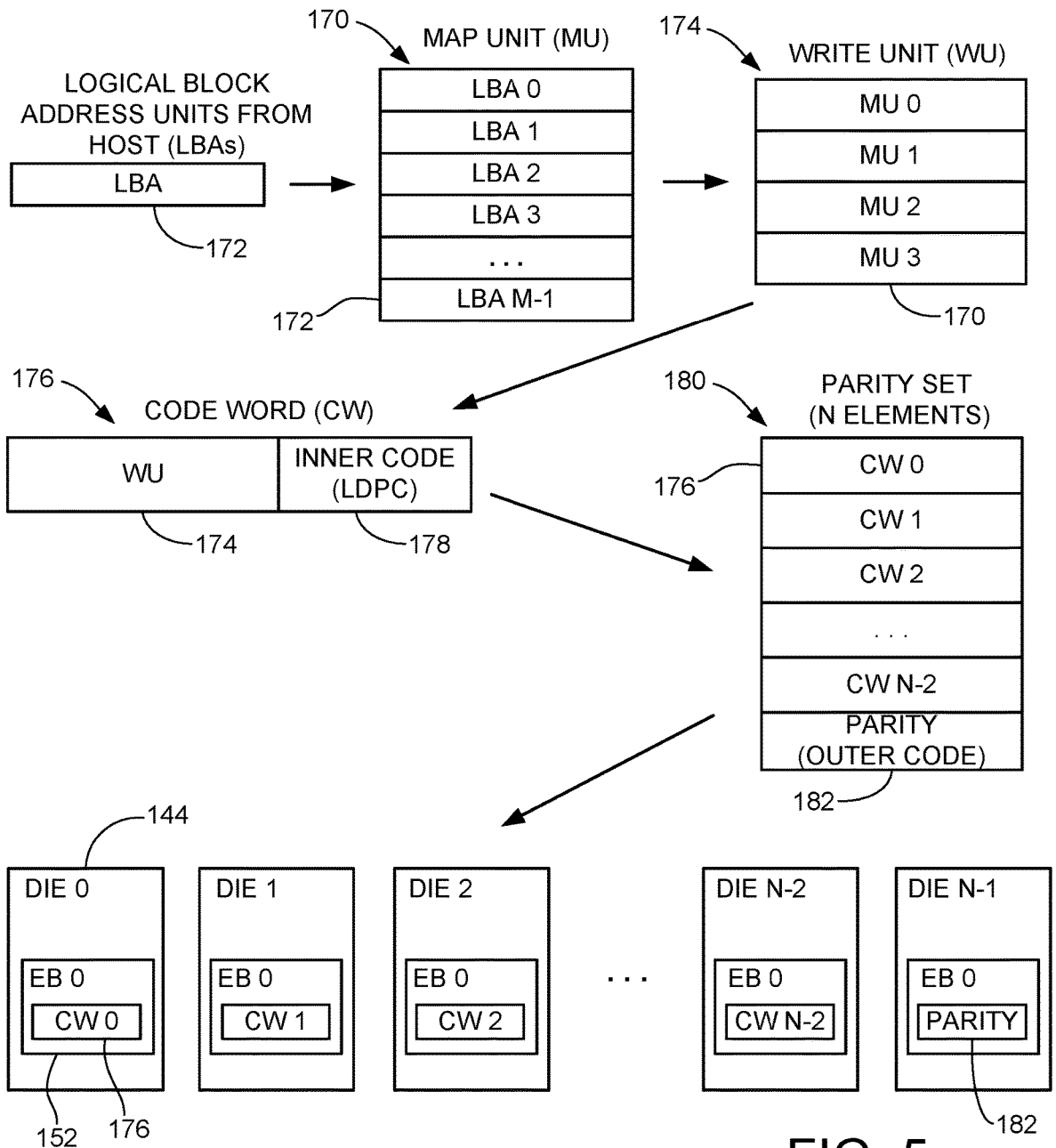
FIG. 5 illustrates a map unit (MU) as a data arrangement stored to the flash memory of FIG. 2.

FIG. 5 illustrates a manner in which user data are stored to the flash memory module 142 in accordance with some embodiments. Map units (MUs) 170 represent fixed sized blocks of data that are made up of one or more user logical block address units (LBAs) 172 supplied by the host. Without limitation, the LBAs 172 may have a first nominal size, such as 512 bytes (B), 1024B (1 KB), etc., and the MUs 170 may have a second nominal size, such as 4096B (4 KB), etc. The application of data compression may cause each MU to have a smaller size in terms of actual bits written to the flash memory 142.

As noted above, in one example each page 150 represents nominally 16 KB of user data capacity. Hence, each set of four (4) MUs 170 will be grouped together to form a write unit (WU) 174 of nominally 16 KB of user data.

A code word (CW) 176 is formed by appending, to the WU 174, an inner code value 178. It is contemplated that the inner code constitutes low density parity check (LDPC) codes, although other error correction schemes can be used. The number of code bits will vary, but may be on the order of about 10 KB or so for 16 KB of user data, depending on the construction of the flash memory 142. As will be recognized, LDPC codes enable fast detection and correction of read errors during a read operation. The inner codes 178 may be generated by the LDPC module 138 (see FIG. 2) in preparation of writing of the WU 174 to the flash memory.

Some number of code words 176 are grouped together to form a parity set 180 having N elements. Nominally, the value N will be based on the number of erasure blocks 152 in a given GCU 154, although this is not necessarily required. For the present example, it is contemplated that N=32 although other numbers of elements can be used. As shown in FIG. 5, the parity set 180 will have N−1 code words 176 (e.g., N−1=31) plus an appended parity value 182. Each of the various code words 176 and the associated parity value 182 are written as a different page of data in the GCU. More particularly, the code words and parity values for a given parity data set may be written to the same page and same designated erasure block (e.g., EB 0) across the respective dies, as shown.

Figure 6:
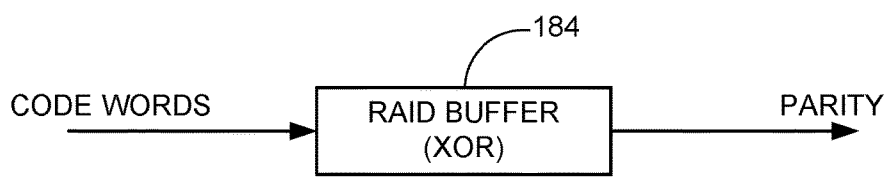
FIG. 6 shows the use of a buffer to generate the parity value in FIG. 5 in accordance with some embodiments.

The parity value 182 represents outer code and can take any number of forms. Without limitation, in one embodiment the parity value 182 represents the output of an exclusive-or (XOR) function applied to the N−1 code words 176. FIG. 6 shows a RAID buffer 184 configured to receive and accumulate the 31 code words 176 in each parity set 180 to generate the parity value 182. In this way, the data from the parity set can be reconstructed even in the event of a single die failure. It follows that nominally 16 KB of parity data protects (16 KB)(31)=496 KB of user data in each parity set, for an overhead ratio of about 3.2%.

The parity sets stored by the SSD 110 are managed using metadata. The metadata provide map structures to track the locations of various data blocks (e.g., MUs 170) to enable the SSD 110 to locate the physical location of existing data within the flash memory 142. During the servicing of a read command, it is generally necessary to locate the physical address within the flash memory 142 at which the most current version of a requested block (e.g., LBA) is stored, so that the controller can schedule and execute a read operation to return the requested data to the host.

During the servicing of a write command, new data are written to a new location, but it is still necessary to locate the previous data blocks sharing the same logical address as the newly written block so that the metadata can be updated to mark the previous version of the block as stale and to provide a forward pointer or other information to indicate the new location for the most current version of the data block.

Figure 7:
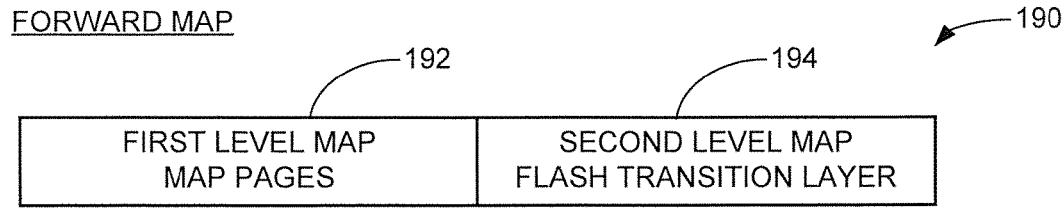
FIG. 7 shows an exemplary format for a forward map used by the SSD in some embodiments.

FIG. 7 shows an example format for a forward map 190 used by the SSD 110 in some embodiments. A two-level map is depicted, although single level or other multi-level maps with three or more levels can be provided as desired.

The forward map 190 includes a first level map 192 and a second level map 194. The first level map 192 provides map pages to identify, for a given range of logical addresses, the entries in the second level map 194. The entries in the second level map 194 provide a flash transition layer (FTL) to generally provide a correlation between the logical addresses of various blocks (e.g., MUs) and the physical addresses at which the various blocks are stored (e.g., NVM set, die, plane, GCU, EB, page, bit offset, etc.).

Forward pointers may be written to the various entries such that, when accessing the map pages and FTL entries, a forward search may take place to locate the final, most current version of a given data block. Once this location is identified, the associated data can be retrieved, etc.

It is generally required that accurate map data be maintained in order to reconstruct the state of the system. A local copy of the map data (or portions thereof) may be maintained in local volatile memory for ease of use by the controller 112. From time to time, the map data may be updated and transferred to the flash memory to provide non-volatile data storage of the map information. The map data may be arranged into parity sets in a manner similar to that described above in FIG. 5 for the host user data written to the flash memory. This will include the periodic generation of map parity values using the buffer 184 of FIG. 6.

Figure 8:
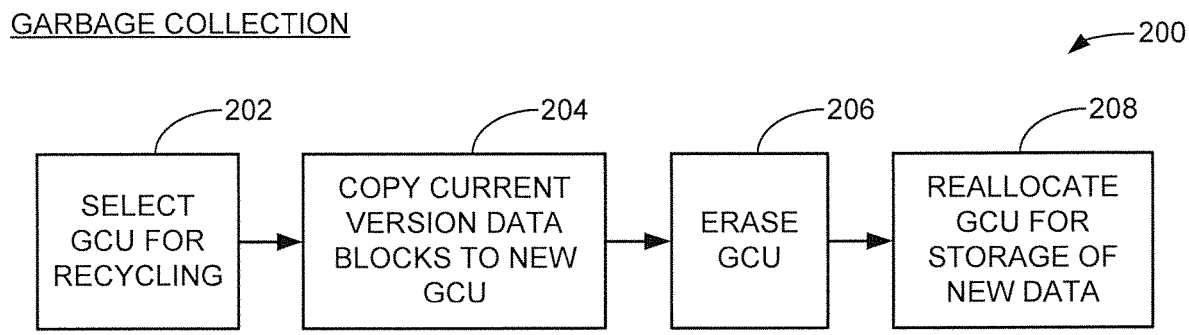
FIG. 8 is a sequence diagram to illustrate a garbage collection operation carried out by the SSD in some embodiments.

FIG. 8 shows a sequence diagram for a garbage collection operation 200. As noted above, garbage collection is a background operation used to collect and relocate current version data prior to an erasure operation upon a GCU to reset the GCU to receive new user and/or map data. The sequence 200 includes the selection of a particular GCU for recycling, as shown by block 202.

The current version user data blocks within the GCU are identified and relocated to a new location at block 204. This can be carried out by referencing the forward map 190, or by using other mechanisms including referencing a reverse directory written to each GCU that lists the contents of the GCU. If the forward map provides a logical-to-physical data structure, the reverse directory can be thought of as a physical-to-logical data structure that indicates, at various physical locations within the GCU, the logical addresses (e.g., MUs) of the blocks at those physical locations.

As part of the processing at block 204, the valid data may be grouped into new parity sets in a manner similar to that shown above in FIG. 5, including the generation of parity data as shown in FIG. 6, and the parity sets will be written to a different GCU.

Block 206 shows the application of an erasure operation to erase the memory cells within the GCU. Once erased, the GCU is returned to a GCU allocation pool for future allocation for storage of new data, as indicated by block 208.

Figure 9:
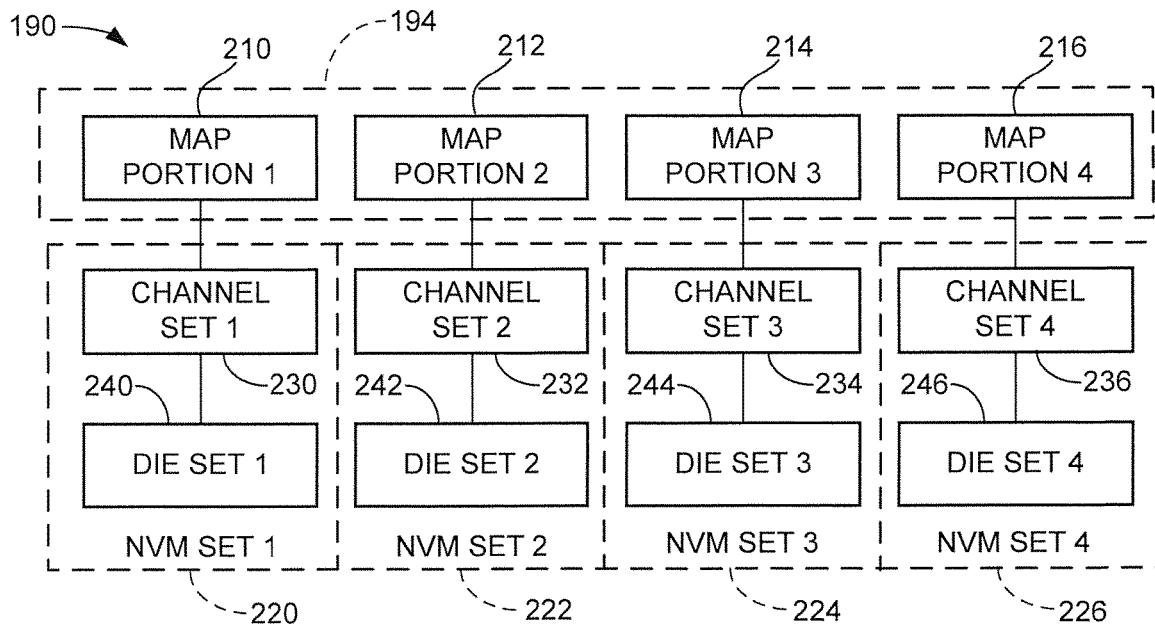
FIG. 9 shows the segregation of the forward map into various map portions for different channel and die sets in accordance with some embodiments.

FIG. 9 shows the forward map 190 of FIG. 7 arranged into four (4) distinct and independent sets of map data, also referred to as map portions 210, 212, 214, 216. The map portions are denoted as map portions 1-4 and serve to describe the user data in four (4) corresponding NVM sets 220, 222, 224, 226 (NVM sets 1-4). The division of the forward map in this manner provides certain processing advantages, but is not necessarily required.

The NVM sets 1-4 each have an associated channel set 230, 232, 234, 236 and an associated die set 240, 242, 244, 246. In one example, each of the channel sets 1-4 constitutes two (2) of the eight (8) available channels 146, although other arrangements can be used so that the channel sets are overlapping and shared by two or more of the NVM sets. The map portions 1-4 each independently describe the user data stored in the associated die sets 1-4.

Figure 10:
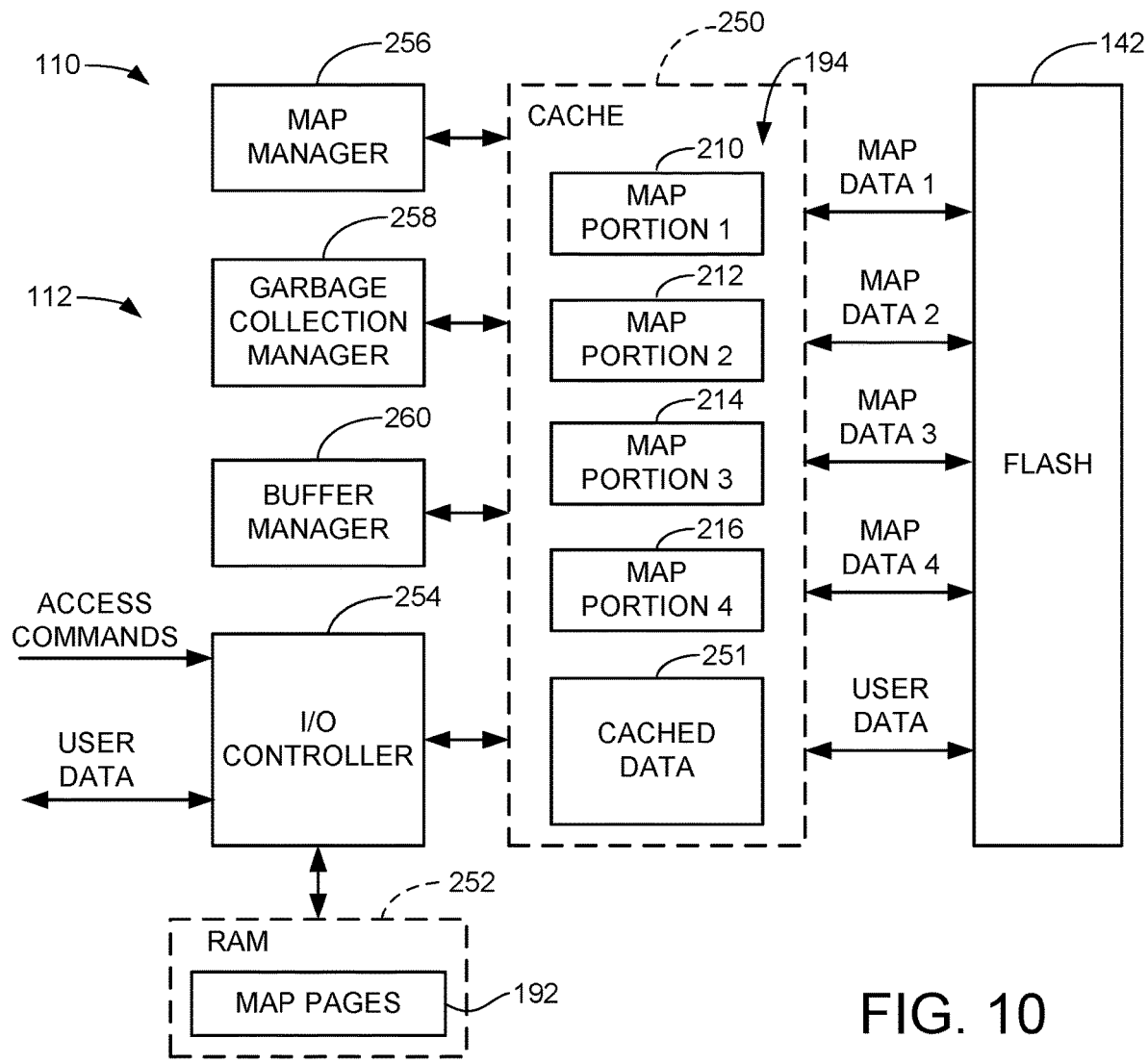
FIG. 10 shows a buffer manager circuit configured to manage various buffer resources during operation of the SSD in some embodiments.

FIG. 10 shows further aspects of the SSD 110 in some embodiments. Current versions of the respective map portions 1-4 are maintained in a local cache memory 250, such as DRAM. The cache memory 250 also stores cached user data 251 during data transfers with the flash memory 142.

The map portions 1-4 represent the second level map 194 (see FIG. 7) to provide the required flash transition layer (FTL) logical to physical addressing to access the flash memory 142. The first level map 192 is stored in a separate local memory, such as on-chip SRAM 252 accessible by an I/O controller (processor) 254 that provides overall data transfer control.

The combined size of the map portions 1-4 can be significantly smaller than a single map that describes the entire flash memory space. This reduction in size arises in part because fewer bits may be required for each map entry to index the smaller corresponding flash space. This provides a number of benefits including faster writes, smaller memory requirements, as well as the ability to concurrently write multiple portions to the flash memory 142 at the same time. Different granularities can be applied to each map portion in turn, including block sizes, parity data set sizes, GCU sizes, etc. Using different map portions thus allows the map data to be tailored to the requirements of a given user.

FIG. 10 further shows a map manager circuit 256 that manages the map portions. A garbage collection manager circuit 258 manages garbage collection operations as described above in FIG. 8. A buffer manager circuit 260 manages various buffers used by the system to perform various threads including hot, cold and map data transfers.

The various manager and controller circuits 254, 256, 258 and 260 form a portion of the controller 112 in FIG. 2 and may be realized using hardware and/or programmable processor circuitry. All of the map portions 1-4 can be maintained in the cache memory 250 for rapid access by the map manager circuit 256. However, in another embodiment subsets of the map portions can be transferred in and out of the cache 250 from the flash memory 142 as required to service pending host commands.

Figure 11:
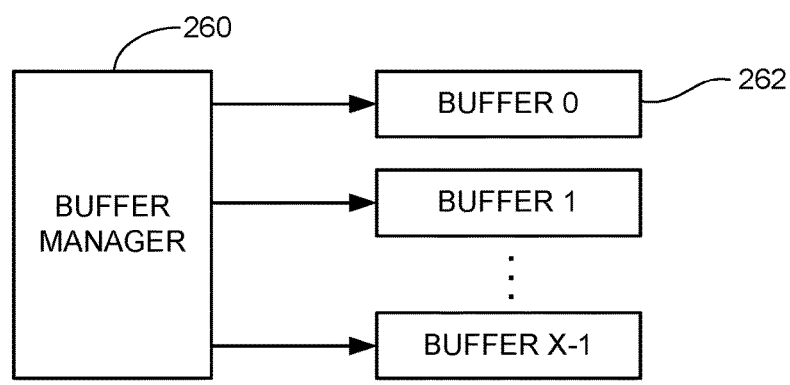
FIG. 11 shows the buffer manager circuit in conjunction with a number of shared buffers used by the circuitry of FIG. 10.

As depicted in FIG. 11, the buffer manager circuit 260 manages the availability and use of various buffers 262. A total of X buffers are shown in FIG. 11. These buffers can correspond to the RAID buffer 184 in FIG. 6. The buffer manager 260 can utilize a variety of approaches to make the buffers 262 available to the respective NVM sets 1-4. In some cases, the buffer manager 260 switches between the use of different approaches at different times based on the requirements of a given operational environment.

Figure 12A:
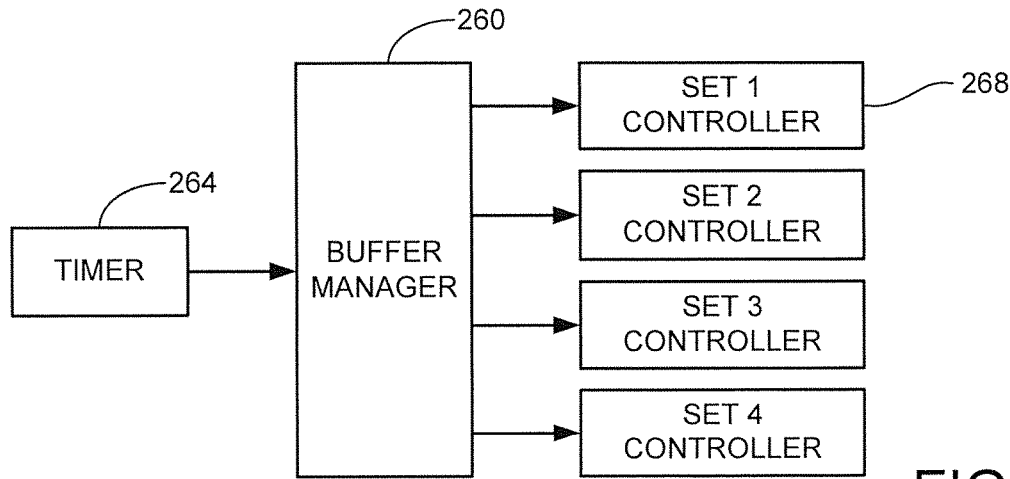
FIG. 12A shows a time-slice buffer management approach used by the buffer manager circuit in some embodiments.
Figure 12B:
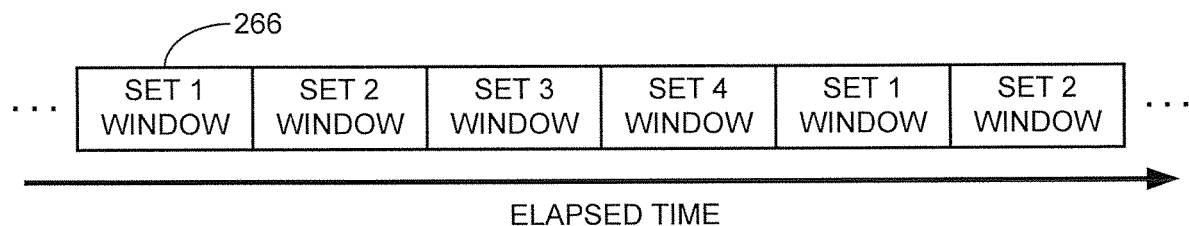
FIG. 12B depicts a number of successive elapsed time windows established by the circuit of FIG. 12A.

FIGS. 12A and 12B show a first approach in which the buffer circuit 260 applies time-slice buffer management. A timer circuit 264 denotes various windows 266 of elapsed time. Each window 266 is assigned to a different one of the sets in a rotating, sequential fashion.

The I/O controller 254 may be divided into four (4) physical or logical set controllers 268, with each set controller responsible for assembling and executing threads associated with the corresponding NVM set. At the beginning of each window 266, the buffer manager 260 informs the associated set controller 268 that a window of availability for a given buffer 262 has now opened. It is wholly up to the set controller 268 to take advantage of the window and use the preferred buffer. One constraint applied to each of the set controllers is that, if the buffer is used, completion of the processing must be carried out by the end of the window. Should an anomalous condition arise that prevents the set controller from completing its use of the buffer, the associated thread will be interrupted and the set controller will transfer the contents to some other location to resolve the error.

As noted above, an advantage of the time-slice approach is that each set controller 268 can plan on the next availability of the shared resource at a fixed future point in time.

Figure 13:
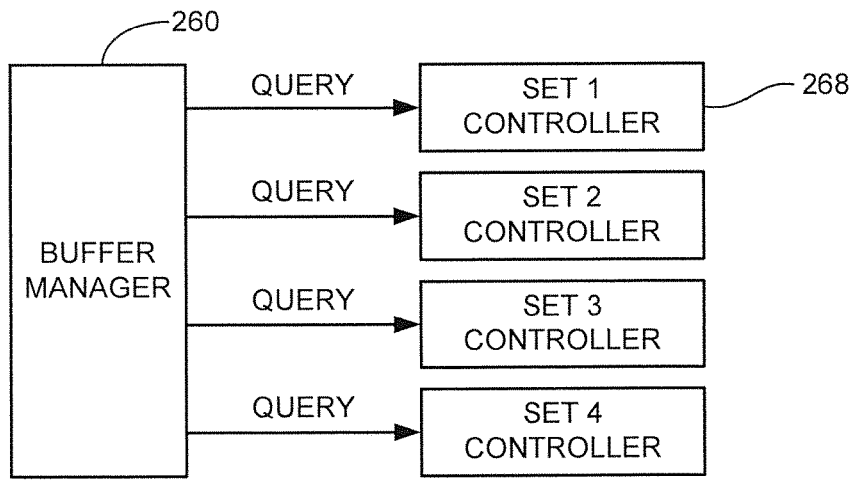
FIG. 13 illustrates a round-robin buffer management approach used by the buffer manager circuit in further embodiments.

FIG. 13 shows the buffer manager 260 employing a round-robin buffer management approach. In this scheme, a rotating sequence is established among the various set controllers 268 as before. When the buffer 262 is available, the buffer manager 260 begins by supplying a query to each set controller 268 in turn to determine if there is a need for the use of the buffer. If so, the set controller assigns the buffer to the set controller, which uses the buffer within a specified window for a particular action. In some cases, the buffer manager may track the usage of the buffer to ensure fairness among the various controllers. For example, if the set 2 controller uses the buffer, the set 3 buffer may be asked first once the buffer becomes available.

Figure 14:
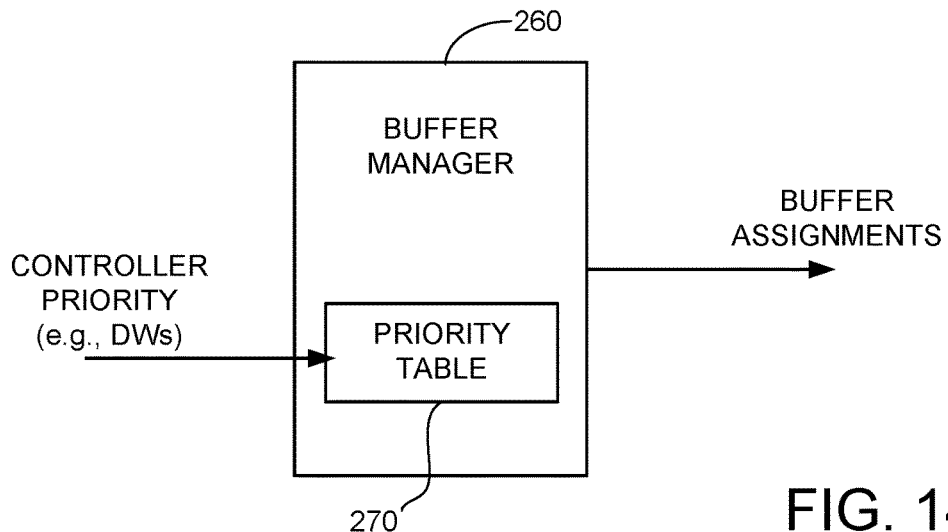
FIG. 14 shows a priority-based buffer management approach used by the buffer manager circuit in further embodiments.

FIG. 14 shows yet another approach in which the buffer manager 260 uses a priority-based scheme to manage the various buffers. In this case, the buffer manager 260 may maintain a priority table 270 or other data structure in memory that indicates the then-existing priority state of each of the sets. As noted above, the SSD 110 may be configured in accordance with the NVMe specification to enable users, from time to time, to declare a deterministic window (DW). During a DW, a certain level of guaranteed performance is provided. The guaranteed performance can be specified in any number of ways. For example, a DW may constitute some number X of reads carried out, without duplication of read data, within some period of time. In another example, a DW may guarantee a certain amount of I/O transfer performance involving reads and/or writes.

It is contemplated that once a particular DW is carried out, there will be a follow-up non-DW period in which the SSD recovers from the focused activity necessary to support the DW. Arbitration of the DW periods among the various set owners can be handled in a manner similar to the buffer assignment (e.g., time-slice, round-robin, etc.).

It follows that during a DW, one of the sets will have priority over the other sets for the duration of the DW period. Buffer assignments may thus be given to the set that has entered deterministic processing. For example, should the set 4 controller 268 (FIG. 13) enter a DW, the buffer manager 260 may offer the shared resources to the set 4 processor on a more frequent basis than the other sets 1-3.

As part of the priority-based approach of FIG. 14, in other embodiments the various set controllers 268 can make requests to the buffer manager circuit 260 for an associated buffer, and the buffer manager arbitrates these requests in an appropriate order.

Figure 15:
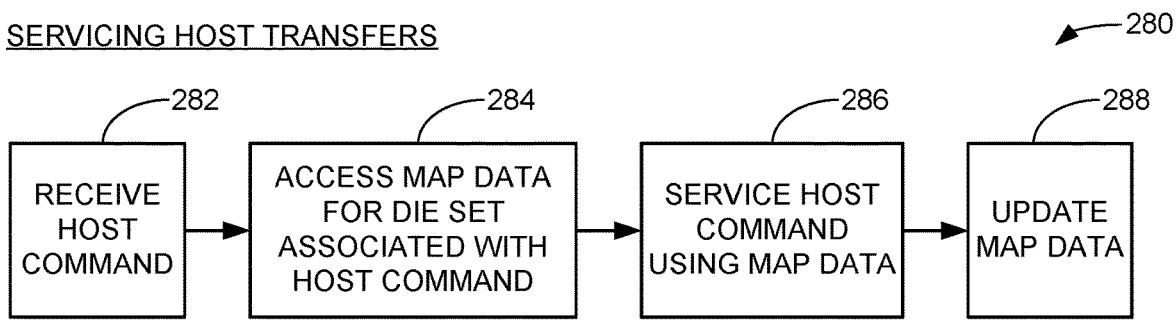
FIG. 15 provides a sequence diagram to illustrate the servicing of host transfers by the SSD in accordance with some embodiments.

FIG. 15 provides a sequence diagram 280 for the servicing of host access commands. A host access command is received from a selected host at block 282 to carry out a selected data transfer operation, such as the writing of data to or the reading of data from the flash memory. The host command will be associated with a selected one of the NVM sets and will be initially processed and placed in a queue pending action by the associated set controller 268.

At block 284, the map manager circuit 256 accesses the appropriate map portion for the command to locate the physical address of data in the flash associated with the command. The host command is serviced at block 286 using the map data accessed in block 284. For a read command, the dies, planes, GCU, EBs, pages, etc. that describe the MU(s) that contain the requested data are accessed and processed to return the requested data to the cache 250. For a write command, the write data are accumulated into one or more parity sets and written as described above in FIG. 5. The map data is updated at block 288 to reflect the new location of the most current version of data, to update an accumulated read count or other use parameters, etc.

The host accesses of FIG. 15 will cause, over time, a need to service periodic background commands such as cold data transfers and map data updates. The cold data transfers may not be limited to those carried out during garbage collection, but for other reasons as well such as read disturbed data, etc.

Figure 16:
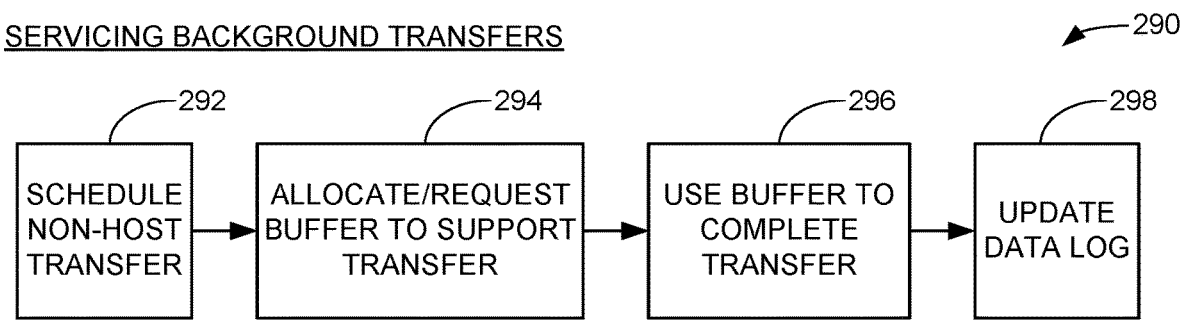
FIG. 16 provides a sequence diagram to illustrate the servicing of non-host (background) transfers by the SSD in accordance with some embodiments.

FIG. 16 shows a sequence diagram 290 for the servicing of background (e.g., non-host related) commands. In some cases, the background commands will be carried out on a scheduled basis, such as certain scheduled calibrations, etc. In other cases, the rate at which the background commands are carried out will be a function of the host transfers within the associated set; a higher frequency of writes of new data, for example, will result in a faster accumulation of map data which in turn will result in a higher frequency of map updates. Moreover, based on the granularity of the parity sets, data may need to be accumulated until it reaches a certain level, after which point a parity value will need to be calculated and the parity set is ready to be written to the flash memory.

A background transfer is scheduled at block 292. It will be understood that the operation of this block implies the progress of the associated thread having reached the point where a buffer is needed to calculate a parity value or for some other reason.

Block 294 shows the assignment of the requested resource to support the background transfer. The buffer is used at 296 to calculate the parity value or as otherwise needed, and the transfer is completed. Block 298 shows the updating of a data log that records the use of the buffer.

It will now be appreciated that the various embodiments present a number of benefits over the art. Providing a manager circuit to manage the use of shared resources among various die sets can ensure enhanced performance across all of the sets. While not necessarily required, the use of separate and distinct map portions for each of a number of different sets can enable more efficient management of the metadata used to control data transfers with each set while maintaining deterministic performance of the SSD or other data storage device While the various embodiments have been described in terms of an SSD in an NVMe environment, other types of storage devices and operational environments can be used as desired. Flash memory is a particularly suitable NVM, but other forms of data storage memory can be used. While a number of RAID buffers have been described as the shared resource, it will be appreciated that other shared resources can be similarly allocated by a resource manager as described herein, such as cryptographic processing engine circuits, error correction code generators and/or processors, etc.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
    dividing a population of semiconductor memory dies connected to a number of parallel channels in a non-volatile memory (NVM) into a plurality of die sets, each die set associated with a user via host access commands, and each die set having an I/O die set controller configured to transfer data to and from the respective die set;
    using a top level controller memory to temporarily store user data while performing hot data transfers by the I/O die set controllers to transfer user data blocks between the die sets and the associated users; and
    while performing the hot data transfers step via one or more of the I/O die set controllers, arbitrating use of a background data memory, separate from the top level controller memory, that is used only to temporarily store background data transfers via no more than only a selected another one of the I/O die set controllers at a time and selected in a predetermined order to perform background data transfers, not associated with the host access commands, between the respective selected die set and the background data memory, and returning the selected one of the I/O die set controllers to the performing hot data transfers of user data blocks step when a next selected one of the I/O die set controllers is subsequently selected according to the predetermined order to perform the background data transfers step so that at all operational times no more than only one of the I/O die set controllers is selected to perform the background data transfers step.

2. The method of claim 1, wherein the background data memory comprises a RAID buffer used to generate a parity value to provide error protection for background data sets transferred during the background data transfers.

3. The method of claim 1, wherein the predetermined order uses a time-slice management approach in which a background data memory manager establishes a rotating sequence of usage windows assigned to each of the I/O die set controllers in turn, wherein the background data memory manager queries the I/O die set controllers at the beginning of each of the usage windows to determine whether the selected I/O die set controller requires use of the background data memory within the associated usage window, and wherein the background data memory remains unused during the associated usage window if the corresponding I/O die set controller does not currently require the use of the background data memory.

4. The method of claim 1, wherein the predetermined order uses a round-robin management approach in which the background data memory manager establishes a sequence order among the I/O die set controllers, and upon availability of the background data memory the background data memory manager queries, in turn, the IO die set controller associated with each of the respective die sets to determine whether any I/O die set controller requires use of the background data memory within the associated usage window, and wherein the background data memory manager assigns the background data memory to the first I/O die set controller that responds to the associated query with a notice of required use of the background data memory.

5. The method of claim 1, wherein the die sets are configured in accordance with the NVMe (Non-Volatile Memory Express) specification, wherein a selected NVM set enacts a deterministic window as a period of guaranteed I/O performance, and wherein the background data memory manager assigns the background data memory to the selected NVM set responsive to the deterministic window.

6. The method of claim 1, wherein each die set is formed of semiconductor memory dies connected to each of the parallel channels.

7. The method of claim 1, wherein each die set is formed of semiconductor memory dies that are connected to less than all of the parallel channels.

8. The method of claim 1, further comprising generating a separate set of map data for each die set as a forward map having a transition layer to associate a logical address of each of the user data blocks of the corresponding die set with a physical address within the die set at which the user data block is stored, wherein the background data memory comprises a RAID buffer used to generate parity data to provide error protection for the map data, and wherein the map data and the parity data are written as the background data transfer to the associated die set.

9. The method of claim 1, wherein the background data transfer comprises a transfer of current version user data blocks to a new location during a garbage collection operation, and wherein the background data memory is a RAID buffer used to generate parity data to protect the transferred current version user data blocks.

10. The method of claim 1, wherein each of the semiconductor memory dies is characterized as a NAND flash memory die comprising a plurality of flash memory cells in which data are stored in relation to accumulated charge in each cell.

11. An apparatus comprising:
a non-volatile memory (NVM) comprising a population of semiconductor memory dies to which are connected a number of parallel channels;
a controller circuit configured to apportion the semiconductor memory dies into a plurality of die sets, each die set configured to store user data blocks associated with a different user via host access commands, and the controller circuit having an input/output (I/O) die set controller for each die set configured to transfer data to and from the respective die set, the I/O die set controllers particularly configured to use a top level controller memory to temporarily store user data while performing hot data transfers to transfer user data blocks between the die sets and the associated users responsive to a sequence of the host access commands issued by the respective users; and
a background data memory, separate from the top level controller memory, used only to temporarily store background data transfers, the controller circuit further having a background data memory manager configured, while one or more of the I/O die set controllers are performing the hot data transfers of user data, to arbitrate the use of the background data memory by only a selected one of the I/O die set controllers at a time and selected in a predetermined order to perform the background data transfers between the respective selected die set and the background data memory, and to return the selected one of the I/O die set controllers to performing the hot data transfers of user data blocks when a next selected one of the I/O die set controllers is subsequently selected according to the predetermined order to perform the background data transfers, so that at all operational times no more than only one of the I/O die set controllers is selected at a time to perform the background data transfers.

12. The apparatus of claim 11, wherein the background data memory comprises a RAID buffer used to generate a parity value to provide error protection for background data sets transferred during the background data transfers.

13. The apparatus of claim 11, wherein the predetermined order is configured to apply a time-slice management approach in which a rotating sequence of usage windows is assigned to each of the I/O die set controllers in turn, wherein the background data memory manager queries the I/O die set controllers at the beginning of each of the usage windows to determine whether the selected I/O die set controller requires use of the background data memory within the associated usage window, and wherein the background data memory remains unused during the associated usage window if the corresponding I/O die set controller does not currently require the use of the background data memory.

14. The apparatus of claim 11, wherein the predetermined order uses a round-robin management approach in which a rotating sequence order is established among the I/O die set controllers, and upon availability of the background data memory the background data memory manager queries, in turn, the I/O die set controller associated with each of the respective die sets to determine whether any I/O die set controller requires use of the background data memory, and wherein the background data memory manager assigns the background data memory to the first I/O die set controller that responds to the associated query with a notice of required use of the background data memory.

15. The apparatus of claim 11, wherein the die sets are configured in accordance with the NVMe (Non-Volatile Memory Express) specification, wherein a selected NVM set enacts a deterministic window as a period of guaranteed I/O performance, and wherein the background data memory manager assigns the background data memory to the selected NVM set responsive to the deterministic window.

16. The apparatus of claim 11, wherein the controller circuit is further configured to generate a separate set of map data for each die set as a forward map having a transition layer to associate a logical address of each of the user data blocks of the corresponding die set with a physical address within the die set at which the user data block is stored, wherein the background data memory comprises a RAID buffer used to generate parity data to provide error protection for the map data, and wherein the map data and the parity data are written as the background data transfer to the associated die set.

17. The apparatus of claim 11, wherein the background data transfer comprises a transfer of current version user data blocks to a new location during a garbage collection operation, and wherein the background data memory is a RAID buffer used to generate parity data to protect the transferred current version user data blocks.

18. The apparatus of claim 11, wherein the background data transfer comprises a transfer of current version user data blocks to a new location responsive to a read disturb event in which multiple successive reads establish charge drift in storage states of memory cells within the NVM.

19. The apparatus of claim 11, wherein each of the semiconductor memory dies is characterized as a NAND flash memory die comprising a plurality of flash memory cells in which data are stored in relation to accumulated charge in each cell.

20. The apparatus of claim 11 wherein the controller circuit is configured to concurrently transfer data between two of the die sets and the respective users.

21. An apparatus comprising:
a non-volatile memory (NVM) comprising a population of semiconductor memory dies to which are connected a number of parallel channels;
a controller circuit configured to apportion the semiconductor memory dies into a plurality of die sets, each configured to store user data blocks associated with a different user, and to transfer data between each of the die sets and respective host devices corresponding to the associated users, the controller circuit particularly configured to perform hot data transfers to transfer user data blocks between the die sets and the associated users responsive to a sequence of host access commands issued by the respective users; and a RAID buffer available for use by each of the die sets in turn to support a transfer of current version user data blocks to a new location during a garbage collection operation, the controller circuit further configured, while performing the hot data transfers of user data, to arbitrate the use of the RAID buffer by only a selected one of the die sets at a time in a predetermined order to generate parity data to protect the transferred current version user data blocks, and to return the selected one of the die sets to performing the hot data transfers of user data blocks when a next selected one of the die sets is subsequently selected according to the predetermined order to transfer current version user data blocks to a new location during a garbage collection operation so that at all operational times no more than only one of the die sets is selected to transfer current version user data blocks to a new location during a garbage collection operation.

* * * * *